US008464007B2

(12) United States Patent
 Abts et al.

(10) Patent No.: US 8,464,007 B2
(45) Date of Patent: Jun. 11, 2013

(54) SYSTEMS AND METHODS FOR READ/WRITE PHASE REQUEST SERVICING

(75) Inventors: Dennis C. Abts, Eleva, WI (US);
 Michael Higgins, Eau Claire, WI (US);
 Van L. Snyder, Blaine, MN (US);
 Gerald A Schwoerer, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 481 days.

(21) Appl. No.: 12/484,075

(22) Filed: Jun. 12, 2009

(65) Prior Publication Data
 US 2009/0287889 A1 Nov. 19, 2009

Related U.S. Application Data

(63) Continuation-in-part of application No. 12/274,044, filed on Nov. 19, 2008, now Pat. No. 8,065,573, which is a continuation-in-part of application No. 11/693,572, filed on Mar. 29, 2007, now Pat. No. 8,245,087.

(60) Provisional application No. 60/908,154, filed on Mar. 26, 2007.

(51) Int. Cl.
 *G06F 12/00* (2006.01)

(52) U.S. Cl.
 USPC ........... 711/151; 711/150; 711/154; 711/158; 711/167; 711/168; 710/36; 710/39; 710/40; 710/54; 710/56

(58) Field of Classification Search
 USPC .... 711/150, 151, 154, 158, 167, 168; 710/36, 710/39, 40, 54, 56
 See application file for complete search history.

(56) References Cited

U.S. PATENT DOCUMENTS

| 4,251,863 | A |   | 2/1981  | Rothenberger |         |
|-----------|---|---|---------|--------------|---------|
| 4,479,214 | A |   | 10/1984 | Ryan         |         |
| 4,535,455 | A |   | 8/1985  | Peterson     |         |
| 4,931,870 | A |   | 6/1990  | Hollander    |         |
| 5,212,775 | A | * | 5/1993  | Bikowsky et al. | 710/310 |
| 5,233,614 | A |   | 8/1993  | Singh        |         |
| 5,267,242 | A |   | 11/1993 | Lavallee et al. |      |

(Continued)

OTHER PUBLICATIONS

"Micron designline", Jul. 31, 2003, Micron Technology, Inc, vol. 12, Issue 2. Retrieved on Sep. 29, 2011 from <http://images.crucial.com/pdf/ddr2/ddr2_features_functionality.pdf>.*

(Continued)

*Primary Examiner* — Arpan P. Salva
(74) *Attorney, Agent, or Firm* — Charles A. Lemaire; Jonathan M. Rixen; Lemaire Patent Law Firm, P.L.L.C.

(57) ABSTRACT

Various embodiments include fault tolerant memory apparatus, methods, and systems, including a memory manager for supplying read and write requests to a memory device having a plurality of addressable memory locations. The memory manager includes a plurality of banks. Each bank includes a bank queue for storing read and write requests. The memory manager also includes a request arbiter connected to the plurality of banks. The request arbiter removes read and write requests from the bank queues for presentation to the memory device. The request arbiter includes a read phase of operation and a write phase of operation, wherein the request arbiter preferentially selects read requests for servicing during the read phase of operation and preferentially selects write requests for servicing during the write phase of operation.

21 Claims, 5 Drawing Sheets

U.S. PATENT DOCUMENTS

| | | | |
|---|---|---|---|
| 5,535,220 A | 7/1996 | Kanno et al. | |
| 5,798,670 A | 8/1998 | Lee | |
| 6,513,135 B2 | 1/2003 | Harada | |
| 6,667,926 B1 * | 12/2003 | Chen et al. | 365/221 |
| 6,845,472 B2 | 1/2005 | Walker et al. | |
| 7,003,704 B2 | 2/2006 | Adams et al. | |
| 7,082,453 B1 | 7/2006 | Shackleford et al. | |
| 7,185,246 B2 | 2/2007 | Cochran et al. | |
| 7,277,982 B2 * | 10/2007 | Calvignac et al. | 711/105 |
| 7,283,926 B2 | 10/2007 | Wu | |
| 7,360,035 B2 * | 4/2008 | Jenkins et al. | 711/150 |
| 7,415,640 B1 | 8/2008 | Zorian et al. | |
| 7,467,337 B2 | 12/2008 | Nakamura et al. | |
| 2003/0088805 A1 | 5/2003 | Majni et al. | |
| 2006/0047919 A1 * | 3/2006 | Jenkins et al. | 711/150 |
| 2006/0184832 A1 | 8/2006 | Floyd et al. | |
| 2007/0011396 A1 * | 1/2007 | Singh et al. | 711/105 |
| 2007/0130410 A1 * | 6/2007 | Keller et al. | 710/310 |
| 2009/0177932 A1 | 7/2009 | Abts et al. | |
| 2010/0185897 A1 | 7/2010 | Abts et al. | |

OTHER PUBLICATIONS

"U.S. Appl. No. 11/693,572, Non Final Office Action mailed Mar. 2, 2011", 25 pgs.

"U.S. Appl. No. 11/693,572, Response filed Jun. 2, 2011 to Non Final Office Action mailed Mar. 2, 2011", 13 pgs.

"U.S. Appl. No. 12/274,044, Non Final Office Action mailed Nov. 24, 2010", 20 pgs.

"U.S. Appl. No. 12/274,044, Response filed May 24, 2011 to Non Final Office Action mailed Nov. 24, 2011", 10 pgs.

* cited by examiner

SYSTEMS AND METHODS FOR READ/WRITE PHASE REQUEST SERVICING

CROSS-REFERENCE TO RELATED APPLICATIONS

This application is a continuation-in-part of U.S. application Ser. No. 12/274,044 filed Nov. 19, 2008 (now U.S. Pat. No. 8,065,573), which is a continuation-in-part of U.S. application Ser. No. 11/693,572 filed Mar. 29, 2007 (now U.S. Pat. No. 8,245,087), which claims the benefit of U.S. Provisional Application Ser. No. 60/908,154 filed Mar. 26, 2007; which applications are incorporate herein by reference and made a part hereof.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA904-02-3-0052, awarded by the Maryland Procurement Office.

FIELD OF THE INVENTION

The invention relates generally to computer system memory, and more specifically to a memory manager that provides increased memory bandwidth to memory through read/write clustering.

BACKGROUND

Volatile memory, such as the dynamic random access memory (DRAM) most commonly found in personal computers, is advantageous because if its increased memory density over other, nonvolatile storage. Since volatile memory loses its content when power is cut off, it is generally not useful for long-term storage but, instead, is generally used for temporary storage of data while a computer is running.

A typical DRAM consists of an array of transistors or switches coupled to capacitors, where the transistors are used to switch a capacitor into or out of a circuit for reading or writing a value stored in the capacitive element. These storage bits are typically arranged in an array of rows and columns, and are accessed by specifying a memory address that contains or is decoded to find the row and column of the memory bit to be accessed.

DETAILED DESCRIPTION

DRAM devices such as DDR (Double Data Rate) memory incur a timing penalty when a write request follows a read request. Because the data bus is shared between the read and write references, the memory manager must delay sending the write request to memory until the read data from the previous read request is done with the data bus. In some forms of DDR memory, this delay time is on the order of 6 ns. Typical computer systems ignore this timing penalty and, therefore, face a performance penalty on accesses to memory.

This and other problems are addressed by the various apparatus, methods, and systems described herein. In some embodiments, a memory request arbiter within a memory manager is used to give preference to read requests during a read phase and to give preference to write requests during a write phase. In some such embodiments, the memory request arbiter remains in a read phase until a predefined number of read requests have been serviced. It then switches to a write phase and remains there until a predefined number of write requests have been serviced. In one such embodiment, the predefined number is recorded as a request count in a memory mapped register within the memory manager.

In some embodiments, if there are no requests for the current phase, the arbiter will honor requests of the opposite phase, but will not switch the phase until the request count has been satisfied.

In another embodiment, the request arbiter switches between a read phase and a write phase at predefined intervals.

Figure 1:
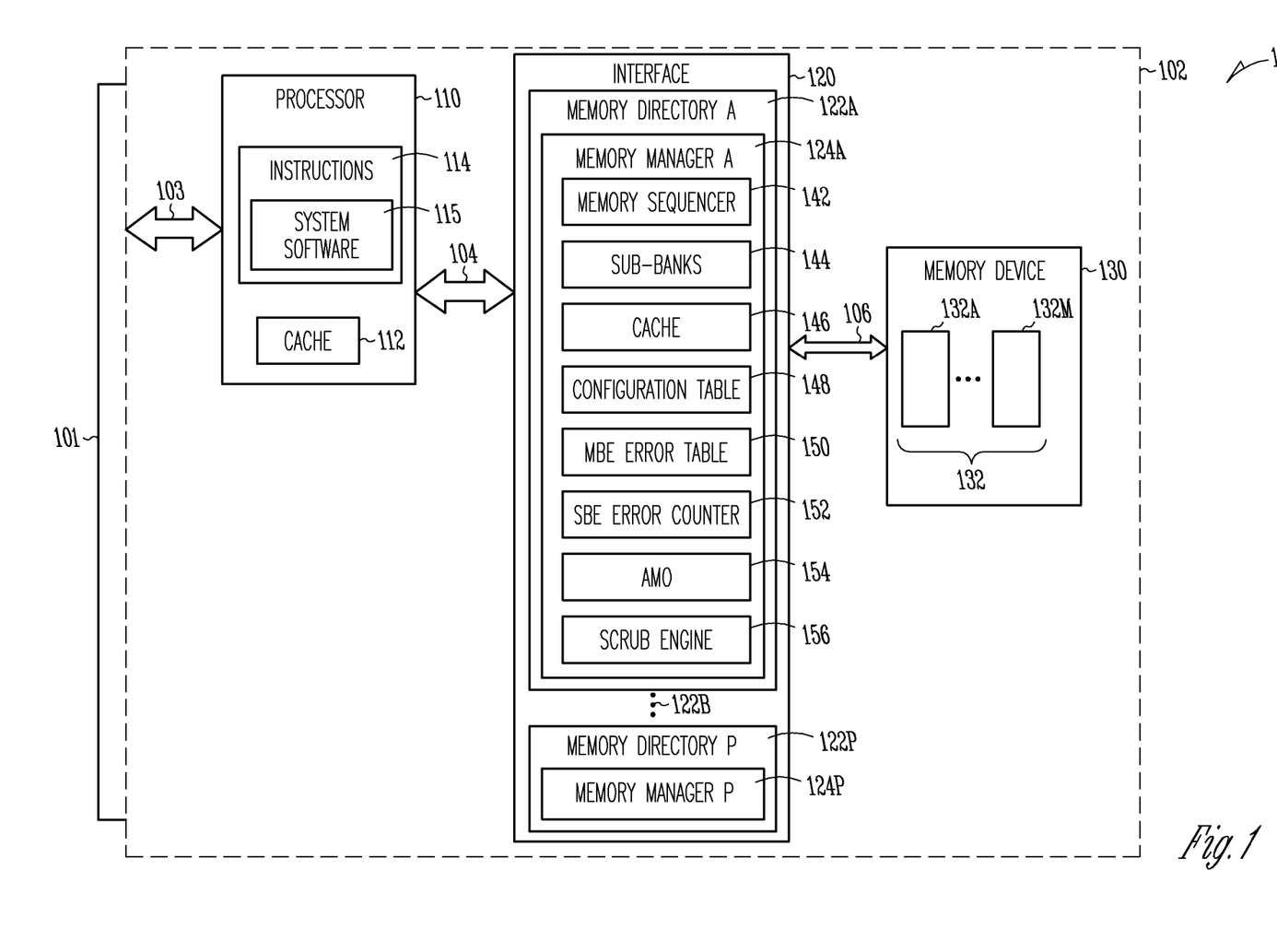
FIG. 1 shows a functional block diagram of an illustrative system including a processor, an interface, and a memory device.

FIG. 1 illustrates a functional block diagram of a system 100, including a processor 110, an interface 120, and memory device 130. In various embodiments, processor 110 is coupled to interface 120 through connection 104. In various embodiments, interface 120 is coupled to memory device 130 through connection 106. Connection 104 and connection 106 are not limited to any particular type of connection, and can include any type of connection or types of connections used to allow the coupling of processor 110, interface 120, and memory device 130. Connection 104 and connection 106 may include physical conductors, wireless connections, or both physical conductors and wireless connections.

In various embodiments, one or more of processor 110, interface 120, and memory device 130 are included on a circuit board 102. Circuit board 102 can include a port 101 for coupling through connection 103 to the devices on circuit board 102, to one or more external devices (not shown in FIG. 1). Connection 103 is not limited to any particular type of connection, and can include physical conductors, wireless connections, or both physical conductors and wireless connections.

Processor 110 is not limited to any particular type of processor. In various embodiments, processor 110 is not a single processor. In various embodiments, processor 110 includes any number of processors operating in a multi-processor system. In various embodiments, processor 110 includes cache memory 112. In various embodiments, each of the multi-processors included in processor 110 include a cache memory 112. In various embodiments, each of a plurality of multi-processors included in processor 110 access cache memory 112, and include a separate cache memory associated with each separate processor.

In various embodiments, interface 120 includes one or more memory directory blocks 122A through 122P. In various embodiments, each memory directory block 122A through 122P includes a memory manager (MM). By way of illustration, memory directory block 122A includes memory manager 124A, and memory directory block 122P includes memory manager 124P. In various embodiments, each memory directory block included in interface 120 would include a separate memory manager, as represented by dotted line 122B. In various embodiments, each memory manager serves and is associated with a designated portion of the memory included in memory device 130.

Memory managers 124A through 124P function as an interface between the memory directory blocks 122A through 122P containing the given memory manager and the memory designated as being backed by a node associated with the given memory directory block. For instance, memory directory block 122A includes memory manager 124A, wherein memory manager 124A functions as an interface between memory directory block 122A and a designated portion of memory device 130 supported by and associated with the memory directory block 122A. In another instance, memory directory block 122P includes memory manager 124P, wherein memory manager 124P functions as an interface between memory directory block 122P and a designated portion of memory device 130 that is supported by and associated with memory directory block 122P.

In various embroilments, one or more of the memory managers 124A through 124P provide one or more of the following:

- arbitration and scheduling of the memory devices, including memory devices according to bank, row, and column dimensions to maximize the effective pin bandwidth of the memory devices;
- Fine-grained atomic memory operations (AMOs);
- Memory refresh and necessary housekeeping functionality to maintain the memory cells used to store data within the memory device;
- Automatic scrubbing of memory to repair single-bit upsets (single bit errors);
- Data poisoning and deferred error handling;
- Detection and correction of single bits error, counting and providing histogramming of the detected single bit errors;
- Spare-bit insertion based on the histogramming of the detected single bit errors; and
- Spare-bit insertion to repair persistent memory errors.

In various embodiments, a given memory manager includes any combination of the following: memory sequencer 142, a plurality of subbanks 144, cache 146, configuration table 148, multiple bit error (MBE) error table 150, single bit error (SBE) error counter 152, atomic memory operation (AMO) unit 154, and scrub engine 156. In various embodiments, memory sequencer 142 uses subbanks 144 to store received requests to read data from the memory device associated with the memory manager 124A. In various embodiments, read data is stored in cache 146. In various embodiments, memory sequencer 142 initiates a retry operation in instances where read data is determined to have a MBE error.

In various embodiments, configuration table 148 is used to store configuration information used by the memory manager 124A, including in some embodiments storing a value for N representing a maximum number of retry operations the memory sequencer 142 is to perform during a given retry operation. In various embodiments, MBE error table 150 is used to log the detection of MBE errors in read data, including intermediate errors and persistent errors. In various embodiments, SBE error counter 152 is used to log the number of occurrences including single bit errors occurring on a particular column of data for one or more portions of the memory device 130 associated with the memory manager 124A.

In various embodiments, AMO unit 154 is used to perform atomic memory operations on one or more memory locations in the portion of memory device 130 associated with memory manager 124A. In various embodiments, AMO unit 154 performs a read-modify-write operation on one or more memory locations in the portion of memory device 130 associated with memory manager 124A.

In various embodiments, scrub engine 156 is used to perform a memory scrubbing operation on some portion of memory device 130 associated with the corresponding memory manager 124A. In various embodiments, scrub engine 156 scrubs a portion of the memory device 130 in order to detect and correct single bit errors in the scrubbed portion of the memory device 130. In various embodiments, scrub engine 156 performs a spare-bit insertion scrubbing operation, including performing a read-modify-write sequence to insert a new spare-bit into data stored in all, or in some embodiments, some portion of, the memory locations included in a the memory device 130 and associated with the memory manager 124A.

Figure 2A:
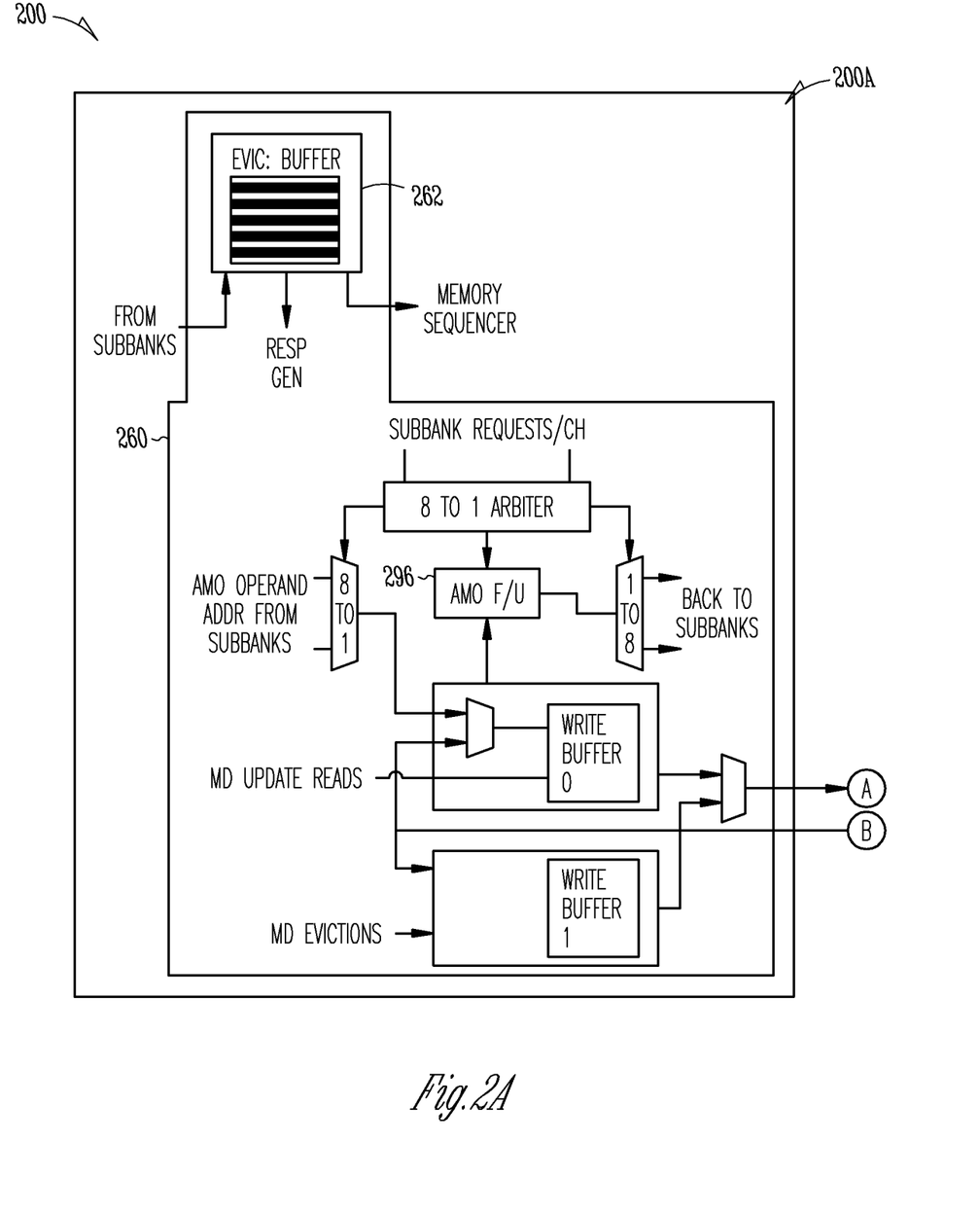
FIGS. 2A and 2B show a functional block diagram of an illustrative memory manager.
Figure 2B:
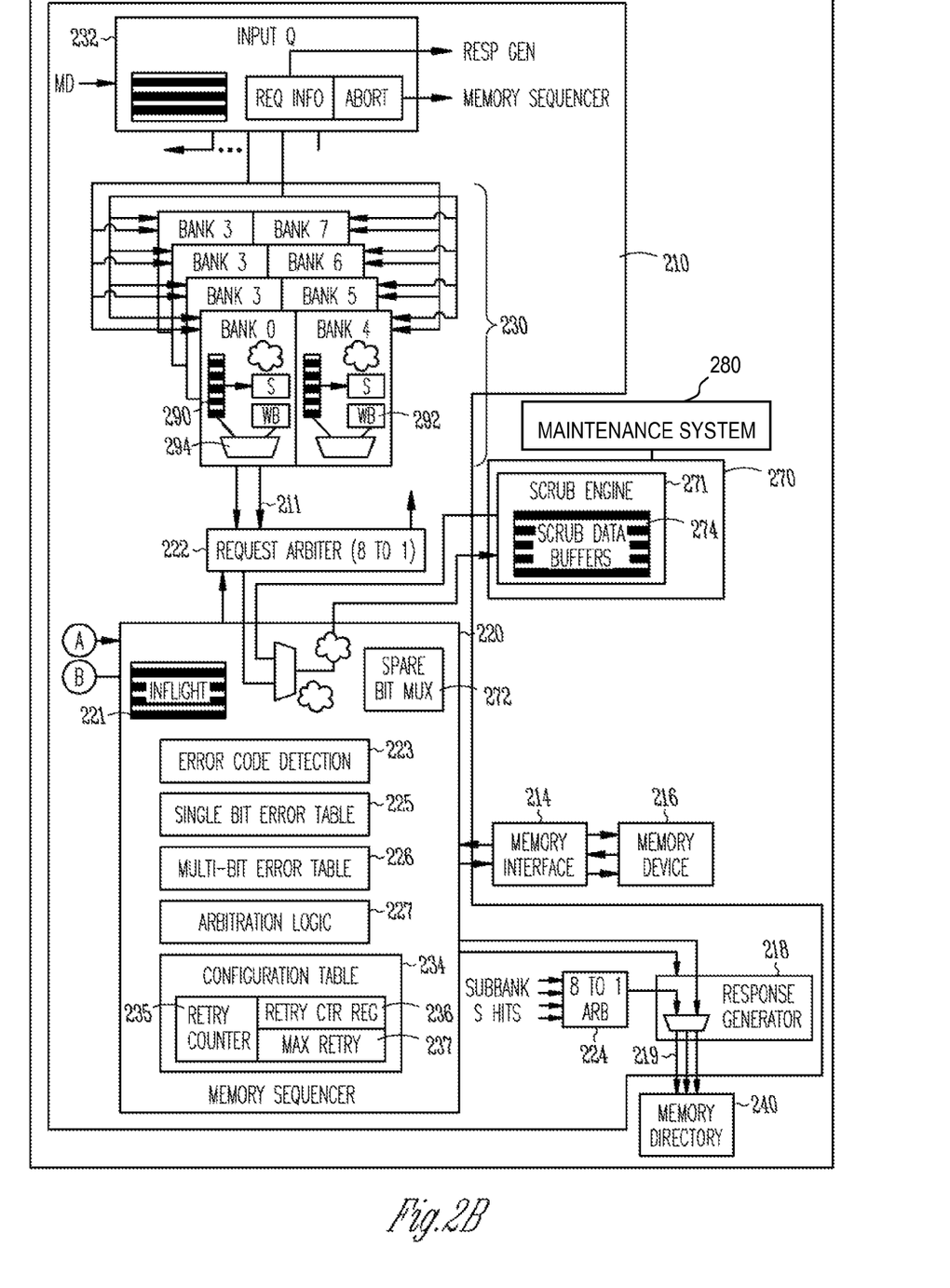

A more detailed description of memory managers and the functions provided by the memory managers, for example but not limited to memory managers 124A through 124P, is provided in conjunction with FIGS. 2A and 2B, and the written description included herein.

Returning to FIG. 1, memory device 130 is not limited to any particular type of memory device. In various embodiments, memory device 130 includes a plurality of memory chips 132 represented by memory chips 132A-M. In various embodiments, memory device 130 includes DRAM memory. In various embodiments, memory chips 132A-M include DRAM memory. In various embodiments, one or more of memory chips 132A-M are double-data-rate two synchronous dynamic random access (DDR2 SDRAM) memory devices.

Memory device 130 is not limited to any particular configuration. In various embodiments, memory chips 132A-M are organized as five 8-bit devices, for a total of 40 bits. In some embodiments, only 39 of the 40 bits are used, where 32 bits are used for data and 7 bits are used to store an error correction code associated with the data bits. In various embodiments, the remaining bit is used to dynamically map out bad bits within the device, including using a spare bit in spare-bit insertion operations to repair persistent single bit memory errors within the memory location or locations providing the spare bit and having a persistent single bit error.

In various embodiments, a memory device, such as memory device 130, provides a given number of bits in any given memory location, wherein not all of the bits in the memory location are used for data and the associated error correction code. In various embodiments, and extra or "spare bit" that exists in each memory location is not initially required in order to store data and the associated error correction code at the memory location. By way of illustration, a memory location includes 40 bits, wherein only 39 bits are needed to store the data allocated for a memory location. In various embodiments, the data includes, by way of illustration, 32 bits allocated for data, and an additional 7 bits allocated for an error correction code associated with the data stored in the 32 bits, all for a total of 39 bits. The 40th bit is considered the spare bit.

When a spare-bit insertion operation has been activated for a given memory location, a given one of the bit positions for the memory location, which can be any one of bits 1-39, is designated as the "bad" bit. A "bad" bit designates a bit position within a memory location that will not be used to store a bit, and the spare bit position will be used to maintain a 39 bit storage capacity within the memory location. In various embodiments, any data bit in data designated to be stored in the memory location and located at a bit position within the data corresponding to the designated "bad" bit is moved for storage purposes to some other bit position in the memory location. The designated "bad" bit position is ignored, and the spare bit is used to maintain the 39 bit storage capability of the memory location.

In operation, interface 120 in system 100 can receive a request to read data from one or more memory locations in memory device 130. The request to read data can come from processor 110. In various embodiments, multiple requests to read data are being handled at interface 120 at any given time. In various embodiments, requests from both processor 110 and scrub engine 156 are capable of being or are being processed at interface 120 at any given time. The term "requester" is used throughout the specification to refer to any application or device that requests data to be read from one or more memory locations in a memory device capable of storing data.

For a given request to read data from a particular memory location, the memory location including data and the associated error code is read from the memory device 130 and provided to the particular memory manager 124A-124P managing the request. In various embodiments, if a spare-bit insertion operation has been completed for the particular memory location, a spare-bit removal operation will be performed on the data as accessed from the particular memory location before further processing of the accessed data is performed. The spare-bit removal operation is described in further detail herein at various portions of the specification.

After reading the data, and after performing a spare-bit removal operation if this operation is activated for the memory location from with the data has been read, the particular memory manager 124A-124P managing the request will use the error correction code included in the read data. This includes determining if the read data has a bit error, including whether the data includes a single bit error or a multi-bit error. In various embodiments, each memory manager includes a set of counters, for example SBE error counter 152, operable to count the number of occurrences of a single bit error for a given bit position in the data.

In various embodiments, when interface 120 receives a request to provide data from memory device 130, and the read data from a particular memory location is determined to have a multi-bit error, a retry operation is initiated. In various embodiments, the retry operation is only initiated when the read data having the multi-bit error is indicated as being non-poisoned data. Poisoning of data in a memory location can be used as an indication that a particular memory location in a memory device includes a persistent multi-bit error. Poisoning may be indicated by a particular value or a particular bit pattern associated with poisoning within a particular memory location where the memory location has been determined to be associated with a persistent multi-bit error.

For the memory locations within a memory device, or in some embodiments where only some particular portions or sections of the memory locations within a memory device are affected, when a spare-bit insertion operation has not been activated for the memory location, data is read from and data is written to the memory location without using a spare-bit insertion operations as part of either the reading or the writing of the data. As part of the reading process, the read data is checked for single bit errors on a bit-by-bit positional basis, and the number of occurrences of the single bit errors for each bit position is tracked using an individual counter for each bit position. The values in these counters can be used to construct a histogram representative of the distribution of the single bit errors that have occurred within the memory locations. Based on this histogram, a determination can be made to activate a single-bit insertion operation for all of the memory location, or in some embodiments, for one or more designated portions of the memory locations within the memory device. Making this determination includes determining that a particular bit position within the data being stored in the memory location of the memory device is faulty, and is designated as the "bad" bit related to a bit position within the data and within the memory locations, all with respect to spare-bit insertion operations. The designated "bad" bit can be a bit position associated with data bits, or a bit position used to store bits including the error correction code associated with the data bits.

As part of activating the spare-bit insertion operation, a spare-bit insertion scrubbing operation is performed. The spare-bit insertion scrubbing operation basically scrubs through the memory locations for which spare-bit insertion operations are to be applied, and performs a read-modify-write operation on the data at each of these memory locations. In various embodiments, all of the memory locations associated with a memory device are scrubbed. For each of the affected memory locations, the read-modify-write operation includes reading the data from the memory location, and writing the data back to the same memory location after applying a spare-bit insertion operation on the data. The spare-bit insertion operation involves re-arranging the bits in the data so that the bit position in the data designated as a "bad" bit position is not used in the memory location to store a data bit, and the spare-bit position in the memory location will be used to store a data bit from the re-arranged data following the spare-bit insertion operation. In various embodiments, the modify portion of the spare-bit insertion scrubbing operations includes checking the read data for single bit errors, and correcting the single bit errors using the error correction code associated with the read data.

Spare bit insertion and spare bit insertion scrubbing is discussed in greater detail in U.S. patent application Ser. No. 12/274,044, filed Nov. 19, 2008, the description of which is incorporated herein by reference.

FIGS. 2A and 2B illustrate a functional block diagram of an illustrative memory manager 200, including portions 200A and 200B. Memory manager 200 is not limited to any particular type of memory manager. In various embodiments, memory manager 200 is any one of the memory managers 124A-124P as shown in FIG. 1. In various embodiments, memory manager 200 is coupled to memory directory 240, as shown in FIG. 2B.

In various embodiments, memory manager 200 includes any combination of the following: AMO unit 260, scheduling unit 210, and scrub unit 270. In various embodiments, AMO unit 260 is coupled to scheduling unit 210 and memory directory 240. In various embodiments, scrub unit 270 is coupled to scheduling unit 210.

In various embodiments, scheduling unit 210 is coupled to and associated with a portion of memory device 216, wherein other memory managers (not shown in FIGS. 2A and 2B) are associated with various different potions of memory device 216. Memory device 216 is not limited to any particular type of memory device, and in some embodiments is memory device 130 as described in conjunction with FIG. 1.

Again referring to FIGS. 2A and 2B, in various embodiments, scheduling unit 210 includes memory sequencer 220 coupled to subbanks 230 through request arbitrator 222. In various embodiments, memory sequencer 220 is coupled to memory directory 240 through response generator 218. In various embodiments, memory sequencer 220 is coupled to memory device 216 through interface 214. In various embodiments, subbanks 230 are coupled to response generator 218 through arbitrator 224.

In various embodiments, memory sequencer 220 includes any combination of the following: error code detection block 223, single bit error (SBE) table 225, multi-bit error (MBE) table 226, arbitration logic 227, and a configuration table 234. In various embodiments, error code detection block 223 is operable to determine if an error exists in read data, both single bit errors and multi-bit errors, based on the error correction code associated with the read data. In various embodiments, SBE table 225 includes a plurality of counter registers operable to store a count value for the number of detected single bit errors associated with a particular column of read data on a bit-by-bit basis. In various embodiments, MBE table 226 is operable to store addresses associated with memory locations that provided multi-bit errors, both intermediate errors and persistent errors, when data was read for the memory locations.

In various embodiments, configuration table 234 is operable to store configuration settings associated with memory manager 200. In various embodiments, configuration table 234 includes a retry counter 235 including a retry counter register 236 and a maximum retry register 237. In various embodiments, retry counter register 236 is operable to store a value for the number of retry read operations that have been performed during a given retry operation associated with a given memory location. In various embodiments, maximum retry register 237 includes a value for a maximum number of retry read operations that are to be performed during a given retry operation associated with a given read request.

In various embodiments, memory subbanks 230 may include a plurality of memory banks 0-7, and an input queue 232. In various embodiments, input queue 232 is coupled to memory directory 240, to response generator 218, and to memory sequencer 220. In various embodiments, input queue 232 is operable to receive from memory directory 240 requests for data to be read from one or more memory location in memory device 216. In various embodiments, subbanks 230 are operable to store these requests, along with a memory manager transaction identifier (MMTID) provided by memory sequencer 220 that uniquely identifies the stored request.

In various embodiments, scrub unit 270 includes scrub engine 271 coupled to memory sequencer 220 and coupled to spare bit mux 272. In various embodiments, scrub engine 271 is operable to provide memory scrubbing operations to any portions of memory device 216 that are associated with memory manager 200. In various embodiments, a scrub data buffer 274 included in scrub engine 271 is operable to store and provide information regarding scrub operation related to memory device 216. In various embodiments, spare bit mux 272 includes a series of 2-to-1 multiplexers, each of the multiplexers are individually controlled through control lines 273 coupled to the spare bit mux 272. Each of the individually controlled multiplexers control a data path for a single bit position within the data being transferred in either direction between the memory sequencer 220 and the memory device 216. In various embodiments, the status of the control lines 273, and thus the control of the individual data paths for each bits in the data being transferred, is controlled by outputs provided by the scrub engine 271 that are coupled to the control lines 273.

In various embodiments, the scrub engine controls the status of the control lines 273 during scrubbing operations, including spare-bit insertion scrubbing operations, and including any routine scrubbing operation, in order to control the data paths of the individual bits within the data being transferred between the memory sequencer 220 and the memory device 216. In various embodiments, control lines 273 are controlled by memory sequencer 220 in order to control the data paths of the individual bits in the data being transferred between the memory sequencer 220 and the memory device 216 during read and write operations involving memory device 216. During these read and write operations, the status of control lines 273 is determined based on whether or not a spare-bit insertion operation has been activated and has been completed for the particular memory locations within memory device 216 that are involved in the particular read or the write operation being performed.

In various embodiments, memory manager 200 includes a maintenance system 280. Maintenance system 280 is not limited to any particular type of maintenance system, and can include any software, hardware, firmware, or any combination of software, hardware, or firmware operable to carry out the functions provided by maintenance system 280. In various embodiments, maintenance system 280 performs polling, histogramming, making determinations, tracking, and storing data related to the spare-bit insertion operation related to memory device 216. In various embodiments, maintenance system 280 is coupled to scrub unit 270, and thus is coupled to memory sequencer 220.

In various embodiments, the memory manager updates histograms within the memory mapped registers (MMRs). The maintenance software included in the maintenance system 280 monitors the histograms, and makes determinations regarding spare-bit insertions based on the status of the monitored histograms. Masks, as further described below, are generated by the hardware based on the spare-bit selection MMRs. In various embodiments, the masks are used to control the spare bit mux 272, as further descried herein.

In various embodiments, a software component of the maintenance system 280 includes one or more masks 282. Masks 282 are not limited to any particular types of masks, and in various embodiments are one or more registers designated to store data related to masks used in spare-bit insertion operations. In various embodiments, masks are used to store a value indicating which of the bit positions within data has been as the "bad" bit position relative to a set of memory locations in the memory device. In various embodiments, maintenance system 280 includes one or more spare-bit insertion registers 284. Spare-bit insertion registers includes one or more registers for storing data related to memory locations addresses that have and have not had a spare-bit insertion operation performed on them during a spare-bit insertion scrubbing operation.

Referring again to FIG. 2B, in some embodiments, maintenance software within the maintenance system 280 is operable to poll one or more of the registers in the memory sequencer 220, including but not limited to the single bit error table 225. Polling the single bit error table 225 includes retrieving the values stored in the counters included in single bit error table 225. After polling these values, maintenance system 280 is operate to use the polled values to construct histograms that track the location of a plurality, or in some instances, all of the single bit errors in a memory device. In various embodiments, maintenance system 280 is operable to analyze the histogram and to determine, based on one or more decision criteria, whether to activate a spare-bit insertion operation, as described in greater detail in U.S. patent application Ser. No. 12/274,044, filed Nov. 19, 2008, the description of which is incorporated herein by reference.

In operation, requests to read data are provided by memory directory 240 to scheduling unit 210. In various embodiments, the requests to read data are provide by the memory directory 240 through input queue 232, and are stored in one of the subbanks 230.

In various embodiments, memory sequencer 220 keeps track of each request individually. In various embodiments, memory sequencer 220 is operable to assign a memory manager transaction identifier (MMTID) to a request, the MMTID to uniquely identify the request from any other requests being processed by memory sequencer 220. In various embodiments, the MMTID for each request are stored in inflight table 221. Memory sequencer 220 organizes and controls the order of the requests to read data from a portion of memory device 216, including the actual receiving of the requested data between the memory sequencer 220 and the memory device 216, using arbitration logic 227. When a particular request is being operated on, a request for the data associated with the particular request is made through request interface 214, and the associated data is read from the memory location within memory device 216.

In various embodiments, memory sequencer 220 includes an error code detection block 223 operable to extract the data bits and the error correction code associated with the data bits as received in the read data, and to determine if an error exists in the data bits based on the error correction code. In instances where no errors are detected, memory sequencer 220 passes the data to response generator 218, which further passes the data to memory directory 240. In instances where an error is detected, the error code detection block 223 is operable to determine if the error is a single bit error or a multi-bit error. If the error is a single bit error, the error correction code can be used to fix the single bit error, and to output the corrected data to the requester. In various embodiments, the single bit error is logged in a SBE table 225. In various embodiments, logging a single bit error includes storing in the single bit error table 225 an indication as to the bit position within the data bits where the single bit error occurred. In various embodiments, the bit position is associated with a particular column line used in reading the bits included in a plurality of memory locations and associated with a same particular bit position within each of the plurality of memory locations.

In instances where memory sequencer 220 determines that a multi-bit error has occurred in the read data, memory sequencer 220 can initiate a retry operation. In various embodiments, initiation of a retry operation includes marking the request with a squash bit to indicate that the request will be retried. In various embodiments, a squash bit includes changing the status of one or more bits included in the MMTID associated with the request for which the retry operation is being performed. The marking of a request with a squash bit prevents the memory directory 240 from getting multiple read replies from a single request that is being retried due to a multiple-bit error.

In various embodiments, memory sequencer 220 can arbitrate the requests going to the memory device 216 using arbitration logic 227 so that the requests associated with the retry operation take precedence over any other requests for data directed to the memory device 216. In various embodiments, upon initiation of a retry operation, memory sequencer 220 will immediately (subject to the bank cycle time of the device) schedule the retry operation. Arbitration logic 227 within memory sequencer 220 gives the retry request priority so that no other requests are allowed to be reordered in front of the retry operation. In other words, the next reference to the memory device 216 where the multi-bit error occurred is guaranteed to the retry request.

In various embodiments, memory sequencer 220 includes a retry counter 235. Retry counter 235 is operable to count the number of retry operations performed for any given retry operation. In various embodiments, retry counter 235 includes a retry counter register operable to store a value indicating the number of retry operations that have been performed during a given retry operation and for a given request. In various embodiments, retry counter 235 includes a maximum retry register 237. Maximum retry register 237 is operable to store a value indicating the maximum number of times a retry operation is to be performed for any given request. In various embodiments, a re-reading of the data from a memory location having a multi-bit error results in the value for the retry counter register 236 being incremented by one. Before any additional re-reading operation for a given request and associated with the retry operations are performed, the value stored in the retry counter register 236 is compared to the value stored in the maximum retry register 237. If the value in the retry counter register 236 is equal to (or for some reason greater than) the value stored in the maximum retry register 237, no additional re-tries to re-read the data in the given memory location will be performed during the given retry operation associated with the given request. If all the readings for the data from the given memory location that are allowed based on the allowable number of re-tries each result in a multi-bit error being detected, the given memory location will be deemed to have a persistent error.

In various embodiments, if a persistent error is detected, the persistent error is logged in MBE table 226. In various embodiments, logging a persistent error includes storing an address associated with the memory location or memory locations in memory device 216 that generated the persistent error. In various embodiments, if a spare-bit insertion operation has been activated for the memory location being re-read as part of a retry operation, the spare-bit insertion operation will be performed on the re-read data on each re-reading before the error code detection operations are performed on the re-read data.

In various embodiments, scrub engine 271 as included in scrub unit 270 performs a memory scrubbing operation, including the scrubbing of memory locations included in memory device 216, to detect and correct bit errors. Assuming that soft errors follow a uniform distribution in a memory device, the longer a word of used data lives in the memory device 216, the more likely it will be to suffer the effects of any number of soft errors. In the worst case, a sufficient number of bits will be upset to result in silent data corruption. In an effort to prevent independent single-bit errors from compounding to form multi-bit errors and thus result in an application error, the memory manager 200 implements a hardware-based memory scrub engine 271. The scrub engine 271 is capable of cycling through one or more portions of memory device 216, and reading and correcting any encountered single-bit errors by writing back corrected data. In various embodiments, if a spare-bit insertion operation has been activated for the memory location from which the data is being read as part of a scrubbing operation, spare bit mux 272 is actuated in a manner that causes a spare-bit insertion operation to be performed on the read data as the read data is received from memory interface 214 and before the read data is passed to the scrub engine for further processing. The scrub engine 271 could have been implemented to write back non-poisoned double-bit errors as poisoned errors. However, this would result in a loss of the capability of detecting faulty stuck-at memory bits that can be found when a particular word consistently suffers from single-bit errors even after being scrubbed repeatedly.

In order to make the scrub engine 271 as non-intrusive as possible, it is desirable to perform scrub reads when the connection between the one or more portions of memory device 216 is otherwise idle. At the same time, certain quality of service (QoS) guarantees must be made, ensuring that the entire memory device 216 is scrubbed with a specified refresh frequency. To satisfy these requirements, scrub engine 271 uses a scheme in which a memory device scrub cycle is broken up into fixed periods, each of which will include a single scrub read request.

In addition, each scrub period is divided into two distinct time regions, the first of which will perform an early scrub read if no other traffic is present at the eight-to-one request arbiter. However, at some point the scrub request must be considered a priority, and in the second phase of each period, user requests will be blocked out allowing the memory device 216 to idle and make way for the pending scrub request.

As an alternative to the memory device auto-refresh capability, the scrub unit 270 may in some embodiments implement a distributed refresh algorithm that avoids the bank quiescence necessary with auto-refresh, and consumes less pin bandwidth than auto refresh. However, with higher-density parts (with more rows that need to be refreshed in a distributed manner) the benefit is more modest. Distributed refresh works by interleaving reads requests, whose purpose is to merely touch and refresh memory, into the normal request stream. When distributed refresh is enabled, scrubbing is piggy-backed on top of it, allowing all of the scrub reads to be performed at no cost. With memory scrubbing, the memory manager 200 is able to cope with uniformly distributed memory device soft errors without sacrificing memory bandwidth.

In various embodiments, when it is determined that a spare-bit insertion operation is to be activated, the entire memory associated with a particular memory manager, such as memory manager 200, will be processed using the spare-bit insertion scrubbing process, and thereafter will be operated on with regards to any read or write operations by using the spare-bit removal and insertion operation respectively. It would be understood that embodiments are not limited to having the entire memory designed for spare-bit insertion, and that some predetermined portion or portions of a memory device can be designated on an individual basis for spare-bit insertion scrubbing and for spare-bit insertion operations. In would be further understood that in embodiments wherein the entire memory is not designated for spare-bit insertion operations, individual tracking of the portions of the memory locations for which spare-bit insertion operations, and the state of these portions with respect to spare-bit insertion scrubbing would be individually maintained and tracked.

In various embodiments, the tracking of these spare-bit insertion operation and spare-bit scrubbing operations, wherein for the entire memory or for portions of a memory device, are tracked and maintained in spare bits insertion registers, such as spare-bit insertion registers 284 as shown in FIG. 2B. In various embodiments, one or more masks 282 are operable to store information related to which bits within a memory locations, or within a plurality of different memory locations, have been designated as the "bad" bit. In various embodiments, the masks 282 and the spare-bit insertion registers are included in a maintained system, such as maintenance system 280 as shown in FIG. 2B.

In one embodiment, as is shown in FIG. 2B, input queue 232 receives a stream of read and write memory requests. In one embodiment, the request stream is then separated into eight substreams based on, for instance, low-order address bits. Each substream, or bank 230 as they are labeled in FIG. 2B, consists of a staging buffer 290, an AMO write-back buffer 292, and a single two-to-one arbiter 294. These eight substreams feed an eight-to-one request arbiter 222 which selects the next request that will be sent to memory. Once a request is granted at the eight-to-one request arbiter 222, it stalls in the memory sequencer until it is able to be driven onto the memory. In such an embodiment, it is the memory sequencer that keeps precise memory state, ensuring the issuance of only those requests that will not result in a memory timing parameter violation and/or a bus conflict.

In one embodiment, requests are serviced in-order within each substream 230. Atomic memory operations block at the head of staging buffer 290 until completed. In one embodiment, each substream 230 arbitrates for a single AMO functional unit 296 (shown in FIG. 2A), which is used to perform the computational work associated with an AMO.

As noted above, memory devices 216 incur a timing penalty when a write request follows a read request. Typical computer systems ignore this timing penalty and, therefore, face a performance penalty on accesses to memory.

It is, however, possible to limit the effect of switching between read and write memory requests. In one embodiment, request arbiter 222 coalesces read and write requests into groups of similar requests. Performing a group of reads before switching the mode to write references and vice versa reduces the idle time on the data bus and allows greater memory bandwidth utilization.

In one embodiment, the request at the head of each bank 230 is examined as to whether it is a read or write reference. If the request is the type of request which matches the phase (read or write) of the group, then the request can progress to the next stage of arbitration.

In one embodiment, the number of read or write requests that are granted in the current phase (read or write phase) is selectable via a memory mapped register. It has been proven via a performance simulator that a setting of 6 can be an effective number to use in the above embodiment before switching to the other phase. With a setting of 6, request arbiter 222 will switch the phase when six requests of the current phase have been arbitrated. In one embodiment, if there are no requests for the current phase, arbiter 222 will honor requests of the opposite phase, but will not switch the phase until the request count has been satisfied.

In various embodiments, memory mapped registers (MMRs) are used to store configuration information used by the memory manager 124, including in some embodiments storing a value for N representing a maximum number of retry operations the memory sequencer 142 is to perform during a given retry operation. In various embodiments, an MBE error table 150 is used to log the detection of MBE errors in read data, including intermediate errors and persistent errors. In various embodiments, an SBE error counter 152 is used to log the number of occurrences including single bit errors occurring on a particular column of data for one or more portions of the memory device 216 associated with the memory manager 124.

Returning to FIG. 1, memory devices 130 are not limited to any particular type of memory device. In various embodiments, memory devices 130 include DRAM memory. In various embodiments, one or more memory devices 130 are double-data-rate two synchronous dynamic random access (DDR2 SDRAM) memory devices.

In operation, interface 120 may receive a request to read data from one or more memory locations in memory device 130. The request to read data may come from one of the processors 110. In various embodiments, multiple requests to read data are being handled at interface 120 at any given time. In various embodiments, requests from both processor 110 and scrub engine 156 are capable of being or are being processed at interface 120 at any given time. The term "requester" is used throughout the specification to refer to any application or device that requests data to be read from one or more memory locations in a memory device capable of storing data.

For a given request to read data from a particular memory location, the memory location including data and the associated error code is read from the memory device 130 and provided to the particular memory manager 124 managing the request.

After reading the data, the particular memory manager 124 managing the request will use the error correction code included in the read data to determine if the read data has a bit error, including whether the data includes a single bit error or a multi-bit error. In various embodiments, if a single bit error is detected, the single bit error is corrected, and the corrected data is forwarded to the processor in instances where the processor 110 requested the data. In various embodiments, the corrected data is forwarded to the requester having made the request for the read data. In various embodiments including scrub engine 270, where the scrub engine requests the data from memory device 130 and a single bit error is detected, the scrub engine 270 is operable to correct the data using the error correction code, and to write the corrected data back to memory device 130.

In various embodiments, when interface 120 receives a request to provide data from memory device 130, and the read data from a particular memory location is determined to have a multi-bit error, a retry operation is initiated. The retry operation, and other error handling techniques, are described in U.S. patent application Ser. No. 11/693,572, entitled "Fault Tolerant Memory Apparatus, Methods and Systems", filed Mar. 29, 2007, the description of which is incorporated herein by reference.

Figure 3:
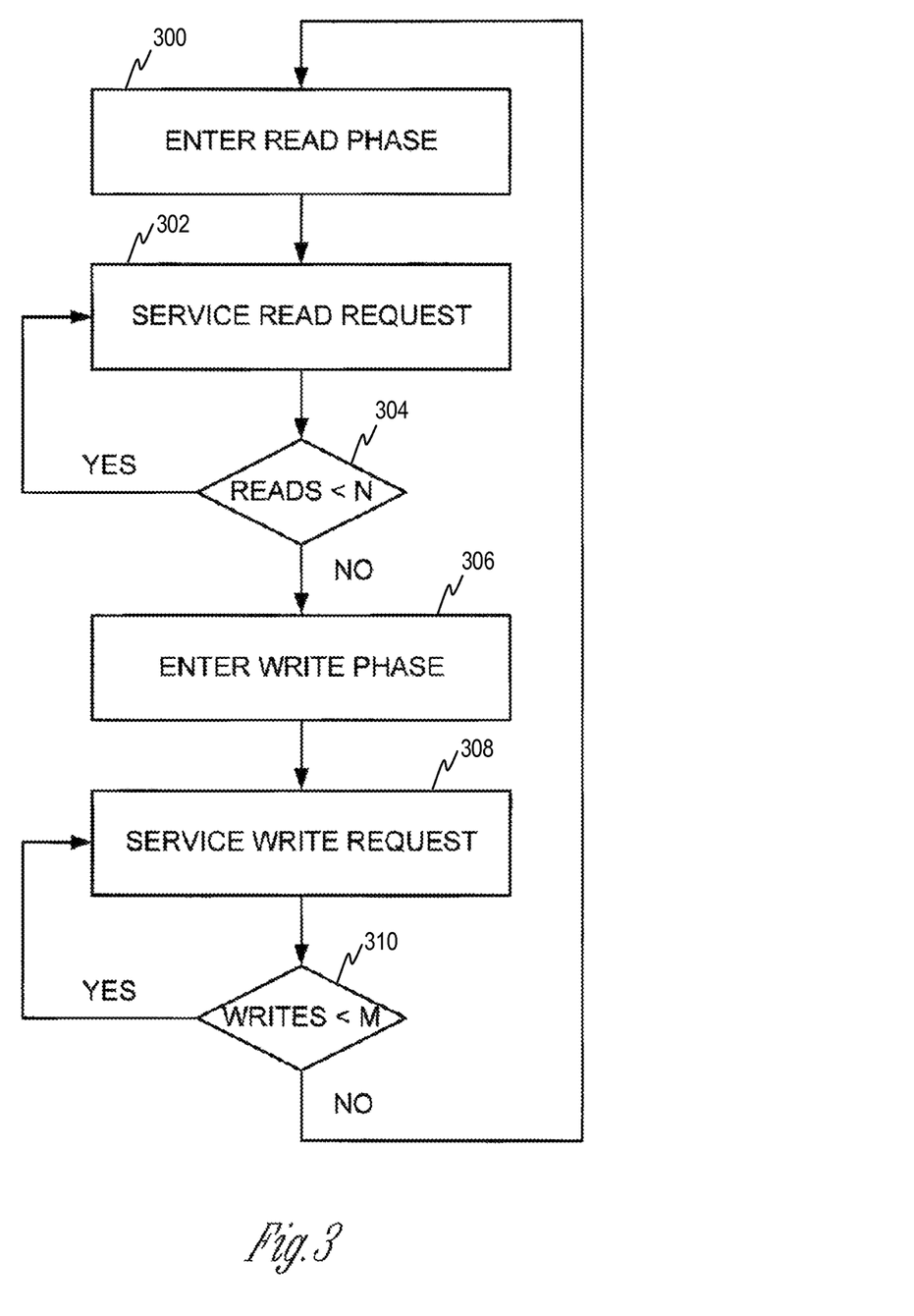
FIG. 3 shows a flowchart for grouping read and write requests.

A method of distributing read and write commands to memory is shown in FIG. 3. In the approach shown in FIG. 3, manager 124 queues up the read and write requests in a memory request queue 290 and enters a read phase at 300. During the read phase, arbiter 222 determines if any read requests are in the memory request queue. If so, arbiter 222 submits the read requests to memory sequencer 220 at 302. In one embodiment, if there are no read requests for the current read phase, arbiter 222 will honor requests of the opposite phase, but will not switch the phase until the request count has been satisfied at 304 (i.e., the number of request is >=N).

Once the read request count has been satisfied, arbiter 222 switches to a write phase at 306. During the write phase, arbiter 222 determines if any write commands are in the memory request queue. If so, arbiter 222 submits the write requests to memory sequencer 220 at 308. In one embodiment, if there are no write requests for the current write phase, arbiter 222 will honor requests of the opposite phase, but will not switch the phase until the request count has been satisfied at 310 (i.e., the number of request is >=M).

In one embodiment, N and M are stored in separate memory-mapped registers accessible by memory manager 124. In one embodiment, a single integer value (e.g., 6) is used to set the number of requests in each phase.

Figure 4:
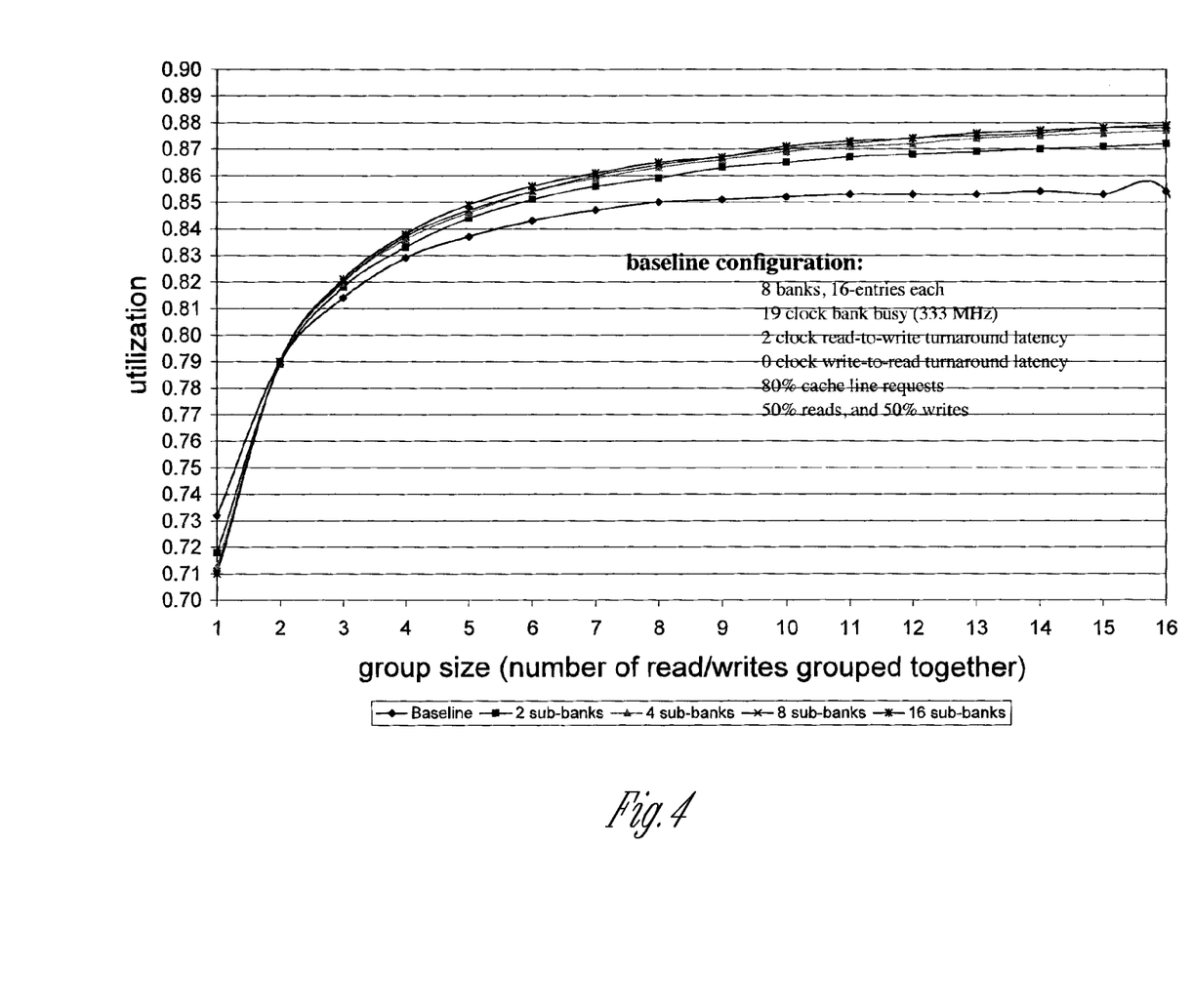
FIG. 4 shows the effect that varying the group size of read/write clustering has on memory channel utilization.

The results of grouping of read and write requests are shown for one configuration of memory manager 124 in FIG. 4. In the example shown in FIG. 4, the controller includes eight banks 230. Each bank can store up to sixteen requests. In the example shown, it was assumed that 80% of the memory requests were cache line requests and that memory requests were split evenly between read and write requests.

As can be seen in FIG. 4, one gains a significant advantage in the utilization of DDR2 memory devices 130 through the coalescing of reads and writes. In one embodiment, by setting M and N to 6, utilization went up about 17%. Choosing group sizes of sixteen provided approximately a 20% increase in utilization in the example shown.

In various embodiments, memory subbanks 230 may include a plurality of memory banks. In various embodiments, input queue 232 is operable to receive from a memory directory requests for data to be read from one or more memory locations in memory device 216. In various embodiments, subbanks 230 are operable to store these requests, along with a memory manager transaction identifier (MMTID) provided by memory sequencer 220 that uniquely identifies the stored request.

In various embodiments, scrub engine 271 is operable to provide memory scrubbing operations to a portion of memory device 216 that is associated with memory manager 124. In various embodiments, a scrub data buffer 274 included in scrub engine 271 is operable to provide a list of data and spare bit insertion information to be used by spare bit mux 272 to perform a spare-bit insertion on the data corrected.

In various embodiments, memory sequencer 220 keeps track of each request individually. In various embodiments, memory sequencer 220 is operable to assign a memory manager transaction identifier (MMTID) to a request, the MMTID to uniquely identify the request from any other requests being processed by memory sequencer 220. In various embodiments, the MMTID for each request are stored in inflight table 221. Memory sequencer 222 organizes and controls the order of the requests to read data from a portion of memory device 216, including the actual receiving of the requested data between the memory sequencer 222 and the memory device 216.

In various embodiments, the memory device 216 provides 40-bits of data where only 39-bits are needed. The additional data bit can be multiplexed into the data path using a series of 2-to-1 multiplexers, such as spare bit mux 272. The control of each mux is selected individually according to the bit position that is to be skipped so that the "spare" bit is used instead. This spare-bit insertion can be done with relatively little interaction with the normal request path. The spare-bit logic is an adjunct to the refresh/scrubbing logic described earlier. If a spare-bit insertion sequence is run, the scrub logic is set to always execute a 32-byte read-modify-write sequence to insert the new spare-bit selection. If the memory manager 124 is set to use auto-refresh instead of the distributed refresh/scrub sequence, the same scrubbing and spare-bit functions execute with the likely difference that the specified inter request wait interval will be set to a longer/higher value. However, it may be desirable to change the spare-bit location in a more timely fashion in an effort to avoid potentially compounding errors.

One gains a significant advantage in the utilization of DDR2 memory devices through the coalescing of read and write requests. As shown in FIG. 4, in one example embodiment, utilization rates increased from 8-20%.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the subject matter described herein. It is intended that this subject matter be limited only by the claims, and the full scope of equivalents thereof.

Such embodiments of the subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A memory manager for supplying read and write requests to a memory device having a plurality of addressable memory locations, the memory manager comprising:
    a plurality of banks, wherein each bank includes a bank queue for storing read and write requests from each of a plurality of processors;
    a request arbiter connected to the plurality of banks, wherein the request arbiter removes read and write requests from the bank queues for presentation to the memory device; and
    a memory sequencer connected to the bank queue of each of the plurality of banks, wherein the memory sequencer arbitrates requests going to the memory device so that requests associated with a retry operation take precedence over all other requests for data directed to the memory device;
    wherein the request arbiter includes a read phase of operation and a write phase of operation and wherein the request arbiter preferentially selects read requests for servicing during the read phase of operation but will select write requests for servicing when no read requests are available while remaining in the read phase of operation until a predetermined number of read requests have been serviced, and preferentially selects write requests for servicing during the write phase of operation but will select read requests for servicing when no write requests are available while remaining in the write phase of operation until a predetermined number of write requests have been serviced.

2. The memory manager of claim 1, wherein if there are no available read requests for a current read phase, the arbiter will honor write requests, but will not switch from the read phase until a predefined number N of read requests have been serviced, wherein N is an integer greater than one.

3. The memory manager of claim 2, wherein if there are no write requests for a current write phase, the arbiter will honor read requests, but will not switch from the write phase until a predefined number N of write requests have been serviced, wherein the request arbiter includes one or more memory mapped registers (MMRs), and wherein the MMRs store, as request counts, an integer value greater than one for M and an integer value greater than one for N.

4. The memory manager of claim 1, wherein the request arbiter includes a request count N, wherein N is an integer greater than one, and wherein the request arbiter remains in the read phase until N read requests have been serviced before switching to the write phase and remains in the write phase until N write requests have been serviced before switching to the read phase.

5. The memory manager of claim 2, wherein the request arbiter includes one or more memory mapped registers (MMRs), wherein the MMRs include a location for storing a request count.

6. In a memory controller, a method of distributing read and write requests to memory, comprising:
    queuing up read and write requests in a memory request queue; entering a read phase of operation;
    determining if any read requests are in the memory request queue;
    if there are read requests in the memory request queue, transferring up to a predetermined number of N read requests to memory, where N is an integer greater than one;
    if there are no read requests but there is a write request in the memory request queue, transferring the write request to memory while remaining in the read phase of operation until the predetermined number of N read requests have been serviced;
    determining whether it is time to end the read phase of operation;
    if it is time to end the read phase of operation, switching to a write phase of operation;
    determining if any write requests are in the memory request queue;
    if there are write requests in the memory request queue, transferring up to a predetermined number of M write requests to memory, where M is an integer greater than one;
    if there are no write requests but there is a read request in the memory request queue, transferring the read request to memory, while remaining in the write phase of operation until the predetermined number of M write requests have been serviced;
    determining whether it is time to end the write phase of operation;
    if it is time to end the write phase of operation, entering the read phase of operation again;
    determining if any read requests are in the memory request queue
    if there are read requests in the memory request queue, transferring up to N read requests to memory;
    determining if any retry-operation requests are in the memory request queue; and
    if there is a retry-operation request in the memory request queue, immediately scheduling the retry-operation request and placing a priority on the retry-operation request such that no other requests are allowed to be reordered in front of the retry-operation request.

7. The method of claim 6, wherein determining whether it is time to end the read phase of operation includes:
   determining how many read requests have been serviced in a particular read phase; and
   if the number of read requests serviced in the particular read phase is less than a request count, then remaining in the read phase, otherwise switching to the write phase, and wherein the request count is an integer greater than one.

8. The method of claim 7, wherein the method further comprises storing the request count in a memory mapped register.

9. In a memory controller, a method of distributing read and write requests to memory, comprising:
   queuing up read and write requests in a memory request queue;
   entering a read phase of operation;
   preferentially selecting read requests from the memory request queue for servicing during the read phase of operation, and if no read requests are available but there is a write request in the memory request queue during the read phase of operation, then transferring the write request to memory while remaining in the read phase until a predetermined number of read requests have been serviced;
   determining whether it is time to end the read phase of operation;
   if it is time to end the read phase of operation, switching to a write phase of operation;
   preferentially selecting write requests from the memory request queue for servicing during the write phase of operation, and if no write requests are available but there is a read request in the memory request queue during the read phase of operation, then transferring the read request to memory while remaining in the write phase until a predetermined number of write requests have been serviced;
   determining if any retry-operation requests are in the memory request queue; and
   if any retry-operation requests are in the memory request queue, immediately scheduling the retry-operation request and placing a priority on the retry-operation request such that no other requests are allowed to be reordered in front of the retry-operation request.

10. The method of claim 9, wherein determining whether it is time to end the read phase of operation includes:
    determining how many read requests have been serviced in that particular read phase; and
    if the number of read requests serviced in that particular read phase is less than a request count, remaining in the read phase, wherein the request count is an integer greater than one.

11. The method of claim 10, wherein the method further comprises storing the request count in a memory mapped register.

12. A system comprising:
    a processor;
    a memory device; and
    an interface coupling the processor to the memory device, the interface including a plurality of memory managers;
    wherein each memory manager is associated with a different portion of memory, and wherein each memory manager includes a request arbiter and a plurality of banks;
    wherein each bank includes a bank queue for storing read and write requests;
    wherein the request arbiter is connected to the bank queues and removes read and write requests from the bank queues for presentation through the interface to the memory device; and
    wherein the request arbiter includes a read phase of operation and a write phase of operation, wherein the request arbiter preferentially selects read requests for servicing during the read phase of operation, but will select write requests for servicing when no read requests are available while remaining in the read phase of operation until a predetermined number of read requests have been serviced, and preferentially selects write requests for servicing during the write phase of operation but will select read requests for servicing when no write requests are available while staying in the write phase of operation until a predetermined number of write requests have been serviced; the system further comprising:
    a memory sequencer connected to the bank queue of each of the plurality of banks, wherein the memory sequencer arbitrates requests going to the memory device so that requests associated with a retry operation take precedence over any other requests for data directed to the memory device.

13. The system of claim 12, wherein the memory device includes double-data-rate two (DDR2) synchronous dynamic random access memory.

14. The system of claim 12, wherein the request arbiter remains in the read phase until a predefined number N of read requests have been serviced, wherein N is an integer greater than one, then switches to the write phase and remains in the write phase until a predefined number M of write requests have been serviced, wherein M is an integer greater than one.

15. The system of claim 14, wherein the request arbiter includes one or more memory mapped registers (MMRs), wherein the MMRs store, as request counts, an integer value greater than one for M and an integer value greater than one for N.

16. The system of claim 12, wherein the request arbiter includes a request count N, wherein N is an integer greater than one, and wherein the request arbiter remains in the read phase until N read requests have been serviced, then switches to the write phase and remains in the write phase until N write requests have been serviced before switching to the read phase.

17. The system of claim 14, wherein the request arbiter includes one or more memory mapped registers (MMRs), wherein the MMRs include a location for storing a request count.

18. The memory manager of claim 1, wherein the memory sequencer initiates a retry operation in instances where read data is determined to have a multiple-bit error (MBE).

19. The method of claim 6, further comprising initiating a retry operation in instances where read data is determined to have a multiple-bit error (MBE).

20. The method of claim 9, further comprising initiating a retry operation in instances where read data is determined to have a multiple-bit error (MBE).

21. The system of claim 12, wherein the memory sequencer initiates a retry operation in instances where read data is determined to have a multiple-bit error (MBE).

* * * * *